(12) United States Patent
Pilling et al.

(10) Patent No.: US 8,294,249 B2
(45) Date of Patent: Oct. 23, 2012

(54) LEAD FRAME PACKAGE

(75) Inventors: David J. Pilling, Los Altos Hills, CA (US); Jitesh Shah, Fremont, CA (US); Diane Peng, Fremont, CA (US); Derek Huang, San Jose, CA (US)

(73) Assignee: Integrated Device Technology Inc., San Jose, CA (US)

( * ) Notice: Subject to any disclaimer, the term of this patent is extended or adjusted under 35 U.S.C. 154(b) by 1095 days.

(21) Appl. No.: 12/186,447

(22) Filed: Aug. 5, 2008

(65) Prior Publication Data
US 2010/0032818 A1 Feb. 11, 2010

(51) Int. Cl.
*H01L 23/495* (2006.01)
(52) U.S. Cl. ............... 257/676; 257/E23.043; 257/692
(58) Field of Classification Search ............ 257/676, 257/666, E23.031, E23.042, E23.043, E23.044, 257/E23.046, E23.047, E23.048, E23.151, 257/E23.152, E23.153, 692, 734, 773, 776
See application file for complete search history.

(56) References Cited

U.S. PATENT DOCUMENTS

| | | | |
|---|---|---|---|
| 6,608,375 B2 * | 8/2003 | Terui et al. | 257/691 |
| 6,812,580 B1 * | 11/2004 | Wenzel et al. | 257/784 |
| 6,927,096 B2 * | 8/2005 | Shimanuki | 438/113 |
| 7,656,019 B2 * | 2/2010 | Tsutsumi et al. | 257/690 |
| 8,125,060 B2 * | 2/2012 | Li et al. | 257/666 |
| 2003/0038297 A1 * | 2/2003 | Carroll et al. | 257/99 |
| 2004/0227226 A1 * | 11/2004 | Hsu | 257/691 |
| 2005/0167828 A1 * | 8/2005 | Yeo et al. | 257/734 |

OTHER PUBLICATIONS

Bogatin, Eric, *Signal Integrity—Simplified*, Prentice Hall, pp. 136, 159 and 161, 2004.

* cited by examiner

*Primary Examiner* — Fernando L Toledo
*Assistant Examiner* — Victoria K Hall
(74) *Attorney, Agent, or Firm* — Haynes and Boone LLP

(57) ABSTRACT

A lead frame package is disclosed where transmission signals are coupled into a die from a pair of lead frames through bonding wires that are separated by no more than three times a diameter of one of the bonding wires. In some embodiments, pairs of lead frames carrying differential transmission signals can be shielded by adjacent pairs of ground and power leads that are coupled into the die through bonding wires that are also separated by no more than three times a diameter of one of the bonding wires.

16 Claims, 7 Drawing Sheets

LEAD FRAME PACKAGE

BACKGROUND

1. Technical Field

The present invention is related to a lead frame package and, in particular, a lead frame package that can be utilized for high performance serializer/deserializer (SerDes) applications.

2. Discussion of Related Art

Recently available small dimension lead frame packages offer significant cost savings advantages. Heat dissipation in these packages is improved with the die mounted about an exposed die pad. Staggered leads increase lead count and reduce package size. Reduced package height improves signal integrity with leads soldered directly to a top layer of a printed board metallization.

The speed with which signals can be inserted into a die in the lead-frame package is dependent on multiple factors. Those parameters include the inductance of wire bonds, the capacitance of the wire bonds, and the resistance of the wirebonds. The higher impedance inputs due to high capacitive and inductive coupling between bonding wires can lead to restrictions on the speed of such packages.

Poor signal integrity restricts currently available leadframe packages to low frequency applications. Recent advances in leadframe technology, including minimization of bends in the lead frames that result in signal reflections and provide good thermal and electrical conductivity directly to the die, have increased the applicability of modern leadframe packages. However, these packages are yet unable to meet the rate requirements of modern SerDes systems.

Therefore, there is a need for lead-frame packages that allow for high frequency data transmission with a die.

SUMMARY

Consistent with embodiments of the present invention, a lead frame package is disclosed that includes a first pair of lead frames configured to carry transmission signals and coupled to a first pair of die pads by a first pair of bond wires that are separated by less than three times the diameter of one of the first pair of bond wires. In some embodiments, a second pair of lead frames, the second pair of lead frames configured to carry a ground/power pair and coupled to a second pair of die pads that are adjacent to the first pair of die pads by a second pair of bond wires that are separated by less than three times the diameter of one of the second pair of bond wires, may also be included. In some embodiments, the transmission signals are serial receive or transmit differential signals.

In some embodiments, a third pair of lead frames is included, the third pair of lead frames are configured to carry a ground/power pair and coupled to a third pair of die pads, which are adjacent to the first pair of die pads, opposite the second pair of die pads, by a third pair of bond wires that are separated by less than three times the diameter of one of the third pair of bond wires. In some embodiments, a ground die pad may be positioned between the first pair of lead frames and the second pair of lead frames and down bonded to a ground metallization by a ground bond wire may be provided. In some embodiments, there is also provided a first ground die pad positioned between the first pair of lead frames and the second pair of lead frames and down bonded to a first ground metallization by a first ground bond wire, and a second ground die pad positioned between the first pair of lead frames and the third pair of lead frames and down bonded to a second ground metallization by a second ground bond wire.

In some embodiments, a ground metallization of the second pair of lead frames is coupled to a power metallization through a capacitor. Further, in some embodiments the ground metallization is coupled through a wire trace to a second ground metallization, wherein the ground metallization, the wire trace, and the second ground metallization are coupled to a ground plane through vias.

Consistent with some embodiments of the present invention, a method of coupling signals into a die can include coupling transmission signals between a first pair of lead frames and a first pair of die pads through a first pair of bond wires that are separated by less three times one of the first pair of bond wires. In some embodiments, the transmission signals may be either transmit or receive signals. Additionally, in some embodiments the method may further include coupling a first power/ground pair between a second pair of lead frames and a second pair of die pads, which are adjacent to the first pair of die pads, through a second pair of bond wires that are separated by less three times the diameter of one of the second pair of bond wires. Additionally, the method may further include coupling a second power/ground pair between a third pair of lead frames and a third pair of die pads that are adjacent to the first pair of die pads opposite the second pair of die pads through a third pair of bond wires that are separated by less than three times the diameter of one of the third pair of bond wires.

In some embodiments, the method may include down bonding a ground die pad positioned between the first pair of lead frames and the second pair of lead frames to a ground metallization by a ground bond wire. In some embodiments, the method may further include down bonding a first ground die pad positioned between the first pair of lead frames and the second pair of lead frames to a first ground metallization by a first ground bond wire; and down bonding a second ground die pad positioned between the first pair of lead frames and the third pair of lead frames to a second ground metallization by a second ground bond wire.

In some embodiments, the method may further include coupling a ground metallization of the second pair of lead frames to a power metallization through a capacitor. Additionally, in some embodiments the method may include coupling the ground metallization through a wire trace to a second ground metallization, wherein the ground metallization, the wire trace, and the second ground metallization are coupled to a ground plane through vias.

These and other embodiments will be described in further detail below with respect to the following figures.

Figure 1A:
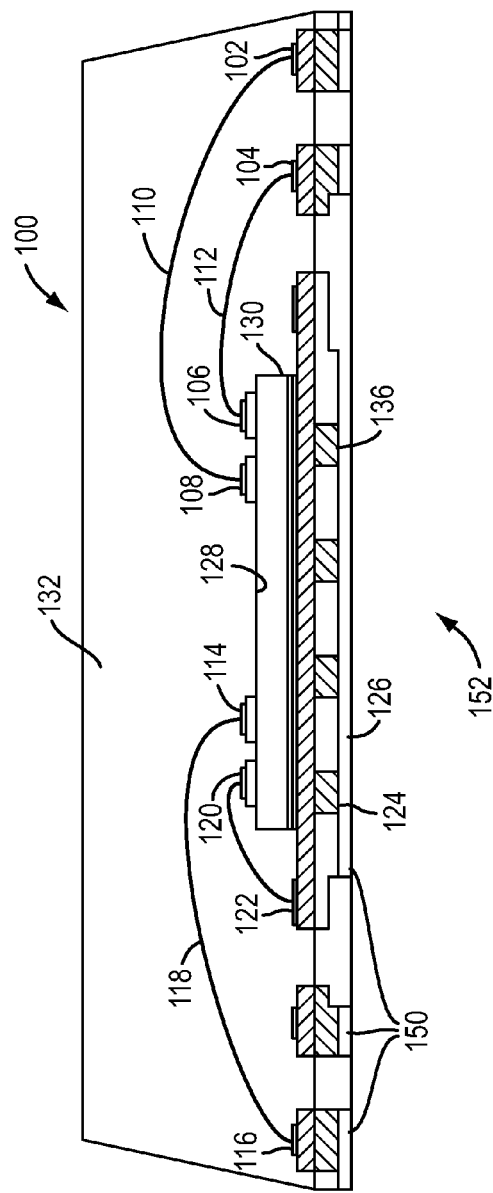
FIG. 1A illustrates a cross-sectional view of a low-profile lead-frame package that can be utilized with some embodiments of the present invention.

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

Some embodiments of the invention provide an improved lead frame package to allow serial data transfer rates in excess of 2 Gbits/sec. These rates can be accomplished by establishing sequences of high speed signal pairs with proximity placement, one to another, approximating a system line impedance (e.g. 50 ohms). In some embodiments, differential power/ground pairs positioned between high speed pairs can provide isolation to minimize crosstalk between signal pairs. Furthermore, close coupling of power and ground lines can reduce package inductive ground bounce, as well as provide isolation between serial transmission pairs.

FIG. 1A shows a cross-sectional outline of a lead-frame package 100 that can be utilized in some embodiments of the present invention. As shown in FIG. 1A, lead-frame package 100 is mounted on metallizations 150 formed on a circuit board 152. As shown in FIG. 1A, lead-frame package 100 includes staggered leads including an outer package lead 102 bonded to an inner die pad 108 with a bond wire 110, and an inner package lead 104 bonded to an outer die pad 106 with a bond wire 112. Typically, bond wires such as bond wire 110 and 112 are gold wires. Further, outer package lead 102 and inner package lead 104 are part of a buried lead frame and are solder plated connections to underlying metallizations 150 of circuit board 152. In many cases, the average vertical separation between bond wires 110 and 112 is approximately two mils, however the horizontal separation is much greater.

As further shown in FIG. 1A, an inner die pad 114 is bonded to an output package lead 116 by a bond wire 118. An outer die pad 120 can be down-bonded to a pad 122 on a buried lead-frame 124, which is mounted with solder plated vias to an exposed ground die pad 126. A die 128 is grounded to buried lead-frame 124 with a conductive die attach 130. An insulating mold compound 132 fills the package volume with insulating material.

The bottom of package 100 can be attached directly to the surface metal of printed circuit board 152 with exposed die pad 136. Heat dissipated by package 100 is then dissipated by the exposed ground die pad 126, which is part of metallization layer 150.

Figure 2A:
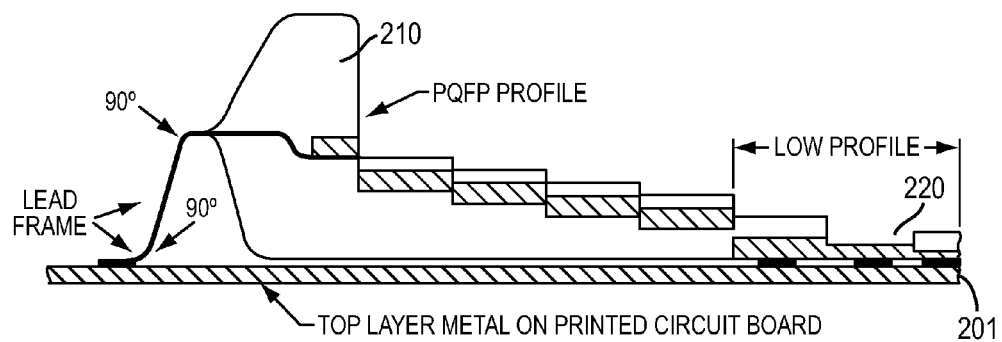
FIG. 2A shows a comparison in package height between a low-profile lead-frame package and a Plastic Quad Flat Pack (PQFP) lead frame package.

Lead-frame package 100 shown in FIG. 1A is a low-profile lead frame package. FIG. 2A illustrates several profiles of lead frame package, from a Plastic Quad Flat Pack (PQFP) profile 210 to a low profile 220. Each of the packages is formed on a circuit board with a top metal layer 201.

Figure 2B:
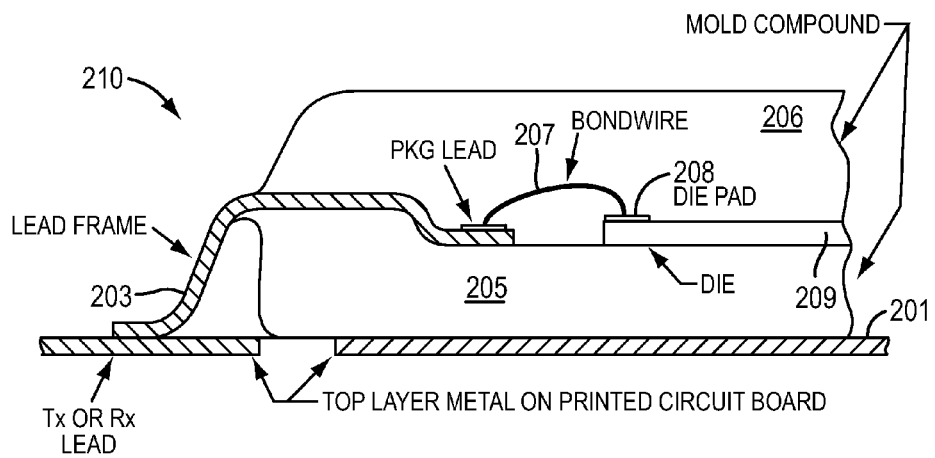
FIG. 2B shows a cross section of a PQFP lead frame package illustrating relative heights of the leads.

FIG. 2B illustrates in greater detail an example PQFP profile 210. As shown in FIG. 2B, lead frame 203 is bent over a mold compound 205. A bond wire 207 couples lead frame 203 to a die pad 208 on a die 209, which is positioned on mold compound 205. A further mold compound 206 covers a portion of lead frame 203, bond wire 207, die pad 208, and die 209. As can be seen, lead frame 203 includes several "right angle" bends, i.e. the bends over mold compound 205, that likely result in signal reflections. Therefore, PQFP profile 210 is limited in data transmission rate.

Figure 2C:
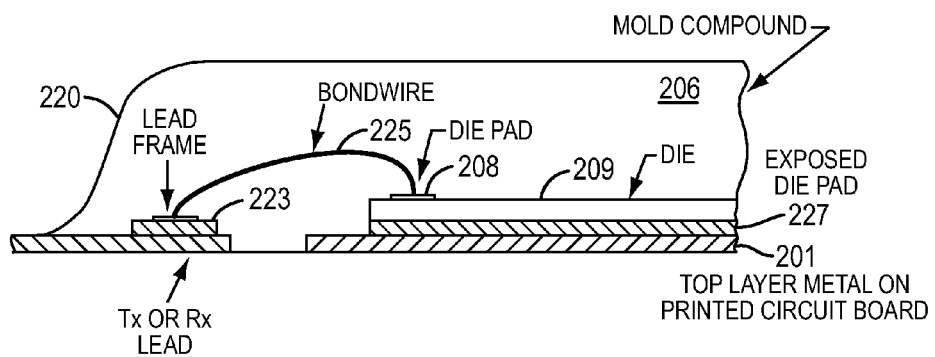
FIG. 2C shows a cross section of a low-profile lead frame package utilized in some embodiments of the present invention.

FIG. 2C illustrates a low profile package 220. A lead frame 223 is mounted on top metal layer 201. Die 209, similarly, is mounted on an exposed die pad 227, which is mounted on top metal layer 201. A bond wire 225 couples lead frame 223 with die pad 208. Mold compound 206 covers lead frame 223, bond wire 225, die pad 208, and die 209. As is shown in FIG. 2C, low profile package 220 greatly reduces the number of sharp bends in lead frame 223 and bond wire 225 for signals to be coupled to die pad 208. Therefore, low profile package 220 is better able to transmit data at high rates.

Figure 1B:
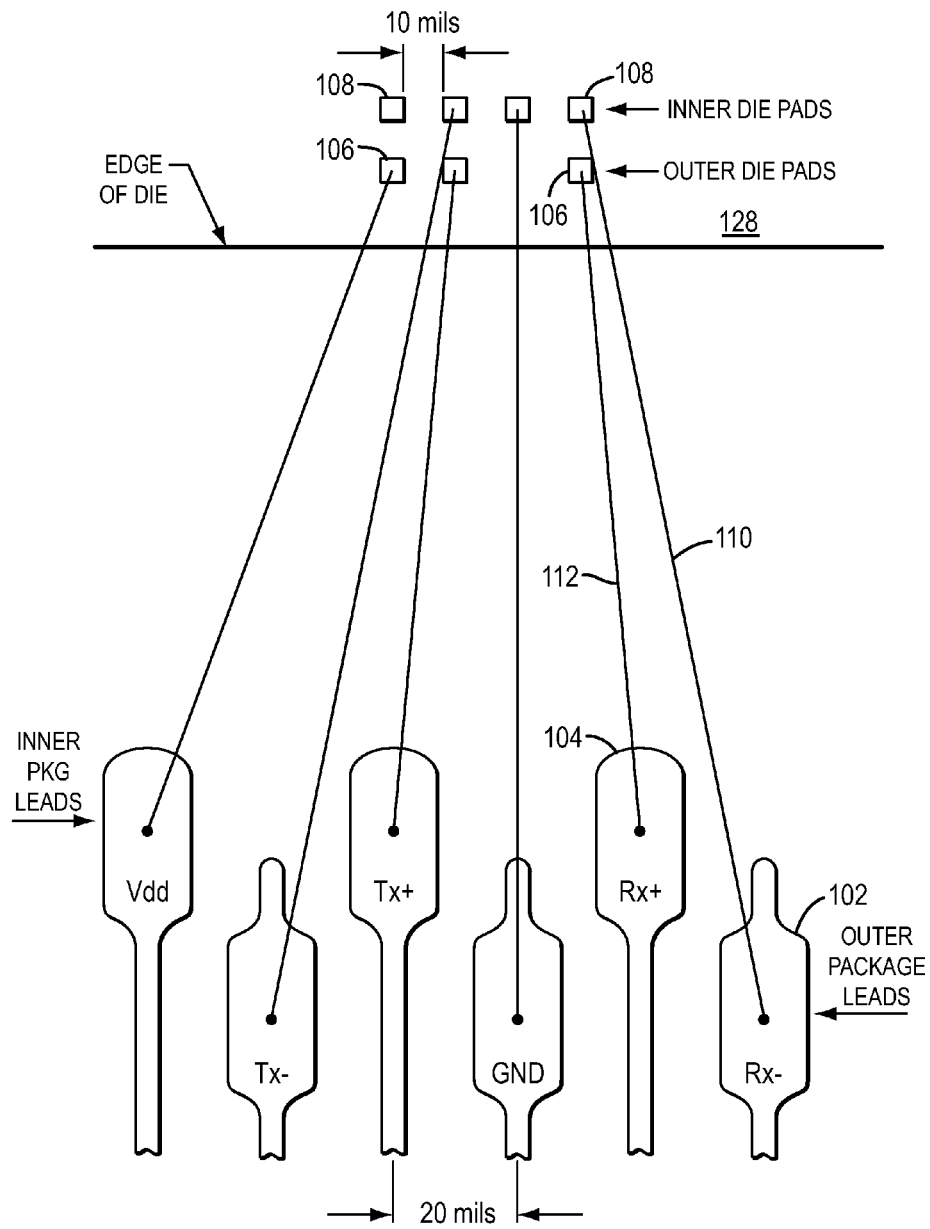
FIG. 1B illustrates a plan view of a typical lead layout for a commercially available lead frame package.

FIG. 1B illustrates a plan view of a typical lead layout for a commercially available lead frame package. As shown, outer package leads 102 are coupled to inner die pads 108 by bond wires 110 and inner package leads 104 are coupled to outer die pads 106 by bond wires 112. In FIG. 1B, the signal lead frame placement is shown as Vdd/Tx−/Tx+/Gnd/RX+/RX−. Transmit signals Tx− and Tx+ and receive signals Rx− and Rx+ are separated by ground and power lines GND and Vdd, respectively. Package leads are typically separated by about 20 mils (0.020 inch) while die pads are separated by about 2 mils (0.002 inch).

In general, leadframe packages such as illustrated in FIG. 1A having a commercially available lead layout such as illustrated in FIG. 1B utilizing a PQFP profile package 210 are restricted to low frequency applications. Packages are available with two rows of leads, either coincident or staggered as shown in FIGS. 1A and 1B with typically twenty mil (0.020 inch) separation between external leads. Recently available leadframe packages feature low profiles in which "ninety degree" bends in the vertical cross section are eliminated.

Figure 3:
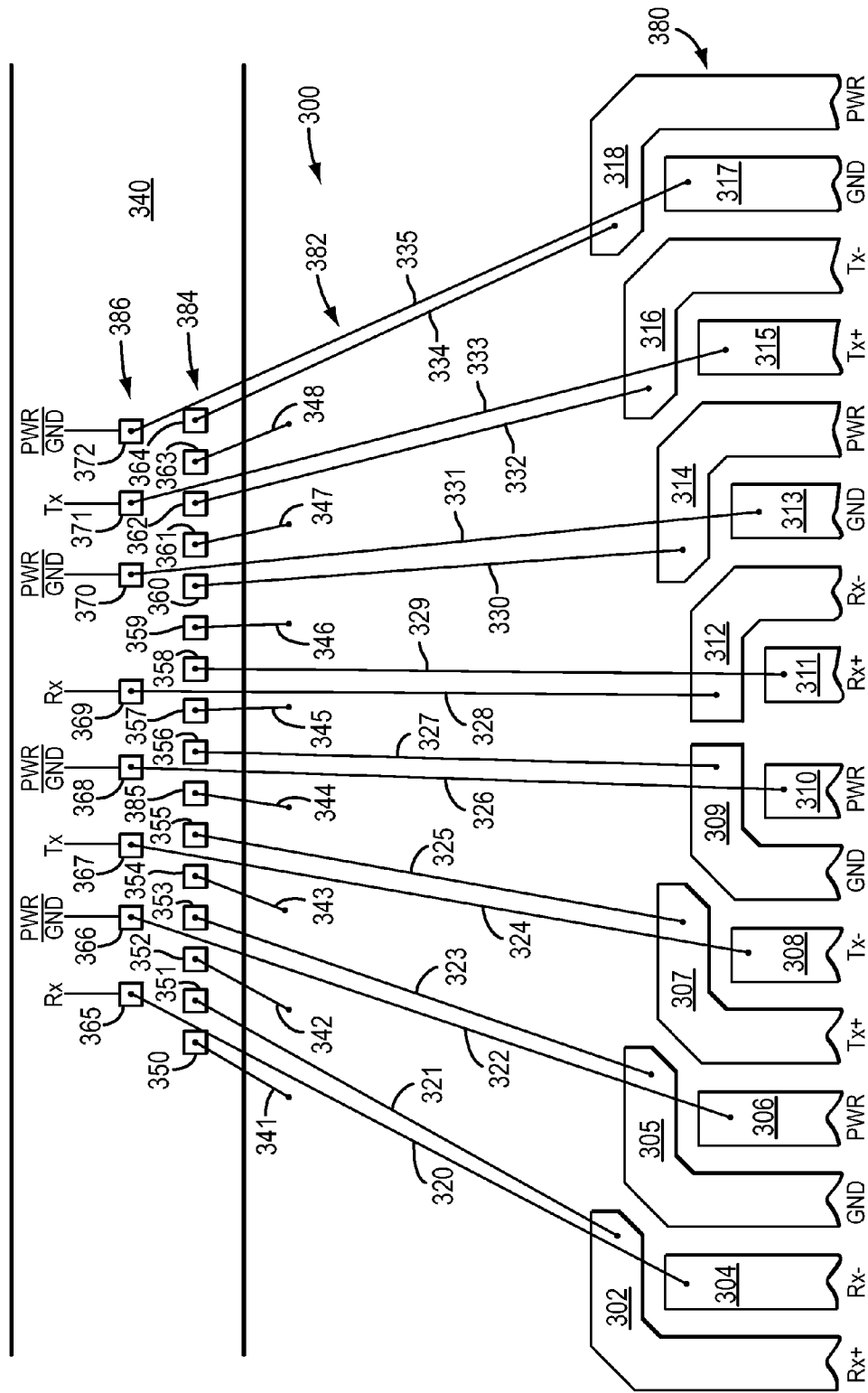
FIG. 3 illustrates a lead frame package according to some embodiments of the present invention.

FIG. 3 illustrates a planar view of a lead layout 300 for utilization with a low profile package, such as package 220 shown in FIG. 2C. FIG. 3 shows a layout for two transmit/receive pairs. As shown, lead frames 302, 304, 305, 306, 307, 308, 309, 310, 311, 312, 313, 314, 315, 316, 317, and 318 (collectively lead frames 380) are coupled to die pads 351, 365, 353, 366, 355, 367, 356, 368, 358, 369, 360, 370, 362, 371, 364, and 372, respectively, by bond wires 320, 321, 322, 323, 324, 325, 326, 327, 328, 329, 330, 331, 332, 333, 334, and 335 (collectively bond wires 382), respectively. Die pads 365, 366, 367, 368, 369, 370, 371, and 372 are collectively referred to as inner die pads 386 while die pads 350, 351, 352, 353, 354, 355 385, 356, 357, 358, 359, 360, 361, 362, 363, and 364 are collectively referred to as outer die pads 384. As shown in FIG. 3, lead frames 380, outer die pads 384, which include die pads 351, 353, 355, 356, 358, 360, 362, and 364, and inner die pads 386, which include die pads 365, 366, 367, 368, 369, 370, 371, and 372, are arranged so that pairs of bond wires 382 that correspond to a signal path are as close together as possible. As such, lead frames 302, 304, 305, 306, 307, 308, 309, 310, 311, 312, 313, 314, 315, 316, 317, and 318 carry signals corresponding to RX+, RX−, Gnd, Pwr, TX+, TX−, Gnd, Pwr, RX+, RX−, Gnd, Pwr, TX+, TX−, Gnd, and Pwr, respectively. Lead frames 302 and 304, which are a RX+/RX signal pair, and die pads 351 and 365 are positioned so that wire bonds 320 and 321 are as close to each other as possible.

The self inductance of a bond wire such as bond wire 320 in semiconductor packages such as lead package layout 300 shown in FIG. 3 is defined by the equation $$V=L(di/dt),$$

where V is the voltage generated by the change in current with time di/dt flowing in a bond wire or trace and L is the self inductance for the isolated wire or trace. The self inductance of a round conducting bonding wire, such as wire bond 320 shown in FIG. 3, is given by $$L=5d\{\ln(2d/r)-3/4\},$$

where d is the length of wire bond 320 and r is the radius of wire bond 320. Therefore, for a 0.001 inches (1 mil) diameter wire of length d=0.0787 inches (2 mm or 78.7 mils), the self inductance L is 1.696 nH.

If there is an adjacent conductor, such as, for example, wire bond 321, a number of magnetic field lines from conductor 320 will envelope the adjacent conductor depending on the distance between the two conductors such that a mutual inductance is created between the two conductors. The mutual inductance between two adjacent wires is defined by $$V=Mdi/dt,$$

where V is the voltage generated by the change in current with time (di/dt) in one conductor and M is the mutual inductance of an adjacent conductor. For the wire bond conductors 320 and 321 that are shown in FIG. 3, for example, the mutual inductance between two bond wires is $$M=5d\{\ln(2d/s)-1\},$$

where s is the center-to-center separation between the two bond wires. In an example where d=0.0787 inches and s=0.002 inches, the mutual inductance is M=1.324 nH.

The advantage of mutual inductance is the property that if two adjacent wire bonds have opposite signal polarity, the mutual inductance term is doubled and subtracted from the self inductance of the single conductors. For example, placing receive terminals 302 and 304 adjacent to each other can result in positioning that allows wire bonds 320 and 321 to be as close as possible while lowering the total inductance seen by the receive signal. In some examples, the total resulting inductance of wire bonds 320 and 321, then, is given by $L=L_{320}+L_{321}-2M$. In the above described example, $L_{320}=L_{321}=1.696$ nH and M=1.324 nH, then the total inductance is L=0.744 nH.

The capacitance between coupled differential wire bonds of length d, radius r, separated by a center-to-center spacing s is given by $$C=\pi\epsilon_0\epsilon_r d/\ln(s/r),$$

where C is the capacitance, $\epsilon_0$ is the permittivity of free space, and $\epsilon_r$ is the relative permittivity of the wire material. Given the 1 mil diameter wire bonds with separation s of two mils, the resulting capacitance is about 40 fF.

The resistance of bond wires is negligible compared to the reactance of the composite chip, bond wire, and package capacitances and inductances. Therefore, the reactance of the lead frames is almost entirely dependent on the inductance of the wire bonding.

As shown in FIG. 3, consistent with embodiments of the present invention, lead frames 380 and corresponding inner die pads 386 and outer die pads 384 are positioned so that the corresponding pairs of wire bonds 382 are closely proximate to one another. As a result, the RX+/RX− pair on lead frames 302 and 304, respectively, and the corresponding die pads 351 and 365 are positioned so that wire bonds 320 and 321 are close; the Gnd/Pwr pair on lead frames 305 and 306 and die pads 353 and 366 are positioned so that wire bonds 322 and 323 are close; and the TX+/TX− pair on lead frames 307 and 308 and the corresponding die pads 355 and 367 are positioned so that wire bonds 324 and 325 are close. As can be seen in FIG. 3, each of the signal pairings, whether it be the RX+/RX− pair, the TX+/TX− pair, or the Gnd/Pwr pair, are arranged to keep the corresponding wire bonds 382 close, thus reducing the reactance of the corresponding signal paths.

In addition to lowering the reactance, crosstalk between adjacent transmit and receive pads can be reduced. As shown in FIG. 3, a Gnd/Pwr signal pair separates each RX+/RX− pair from the closest TX+/TX− pair. Both the physical separation of wire bond pairs that carry receive or transmit signals and the shielding of those wire bond pairs with Gnd/Pwr pairs substantially reduces the induction of signals from a particular wire bond pair to its neighboring signal carrying wire bond pairs. For example, wire bond pair 328 and 329, which couples the RX+/RX− signal pair on lead frames 311 and 312, respectively, to die pads 358 and 369, respectively, is positioned directly adjacent to wire bond pair 326 and 327 and wire bond pair 330 and 331. Wire bond pair 326 and 327 couples lead frames 309 and 310 to die pads 356 and 368 and carries a Gnd/Pwr signal path. Wire bond pair 330 and 331 couples lead frames 313 and 314 to die pads 370 and 360, respectively, and carries another Gnd/Pwr signal path. The nearest other receive or transmit pair to wire bond pair 328 and 329 is two positions away at wire bond pair 324 and 325 or wire bond pair 332 and 333. Therefore, wire bond pair 328 and 329 is well shielded by both the presence of the Gnd/Pwr signals and by physical distance from other transmit or receive signal paths.

As illustrated in FIG. 3, and discussed above, lead frames 380 are spaced relatively far apart compared with outer die pads 384 and inner die pads 386. Therefore, in some embodiments, additional die pads can be added which are down-bonded to ground. As shown in FIG. 3, for example, outer die pads 350, 352, 354, 385, 357, 359, 361, and 363 separate outer die pads 351, 353, 355, 356, 358, 360, 362, and 364. Die pads 350, 352, 354, 385, 357, 359, 361, and 363 are down-bonded to ground with wire bonds 341, 342, 343, 344, 345, 346, 347, and 348, respectively. This arrangement further shields wire bond pairs on lead frames 380 from each other.

Figure 4:
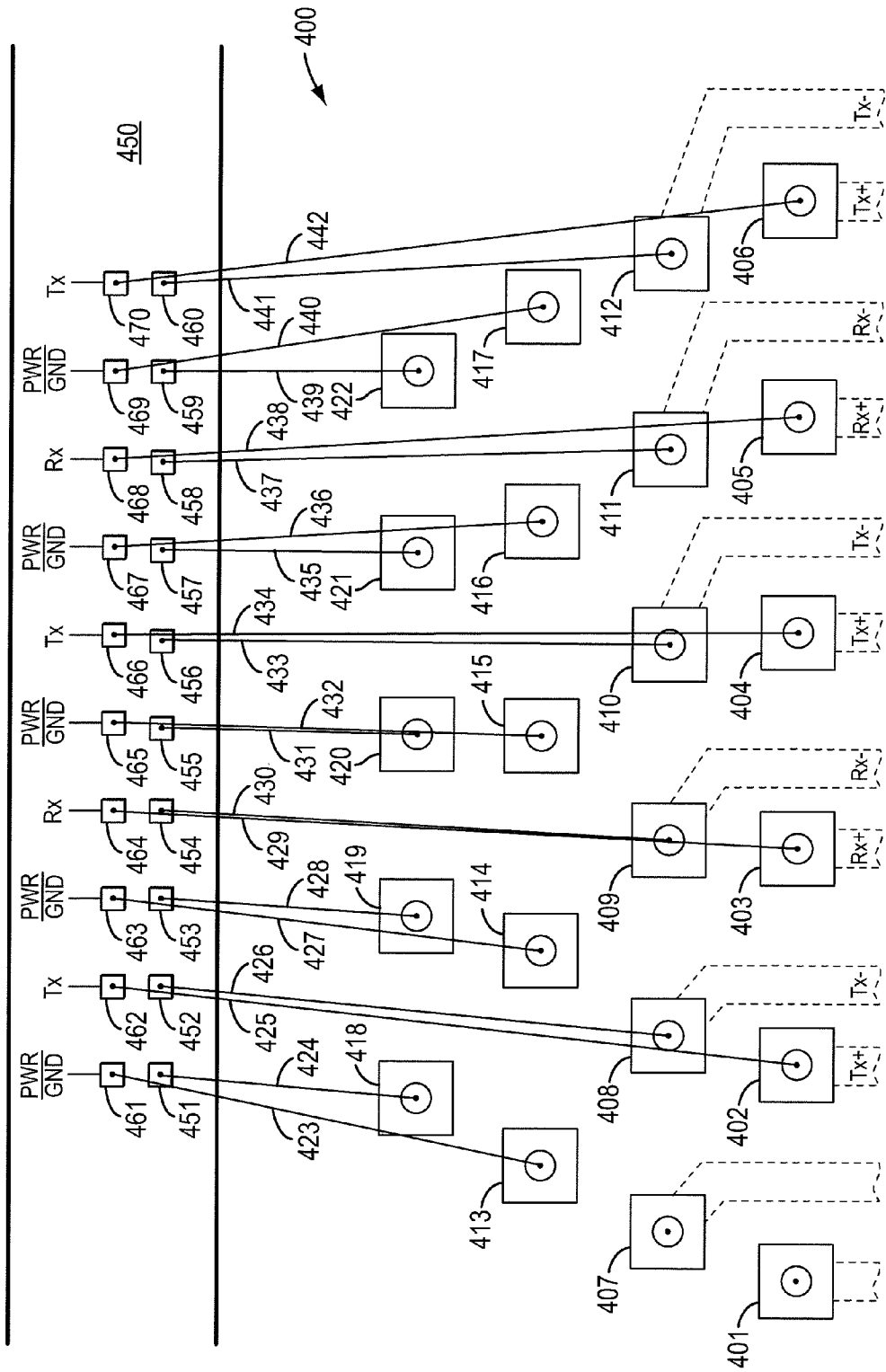
FIG. 4 illustrates another lead frame package according to some embodiments of the present invention.

FIG. 4 illustrates another embodiment of a lead frame package consistent with aspects of the present invention. A lead frame package layout 400 includes outer lead frames 401, 402, 403, 404, 405, and 406 and inner lead frames 407, 408, 409, 410, 411, and 412. Outer lead frames 402, 403, 404, 405, and 406 are coupled to inner die pads 462, 464, 466, 468, and 470 on die 450, respectively, by wire bonds 425, 429, 434, 438, and 442, respectively. Inner lead frames 408, 409, 410, 411, and 412 are coupled to outer die pads 452, 454, 456, 458, and 460 on die 450, respectively, by wire bonds 426, 430, 433, 437, and 441, respectively.

In the embodiment shown in FIG. 4, pairs of lead frames that include one outer lead frame and an adjacent inner lead frame carry transmit and receive signal pairs. As shown, lead frames 402 and 408 carry a TX+/TX− signal; lead frames 403 and 409 carry a RX+/RX− signal; lead frames 404 and 410 carry a TX+/TX− signal; lead frames 405 and 411 carry a RX+/RX− signal; and lead frames 406 and 412 carry a TX+/TX− signal. Pairs of lead frames (i.e., lead frames 402 and 408, lead frames 403 and 409, lead frames 404 and 410, lead frames 405 and 411, and lead frames 406 and 412) are closely proximate to each other so that the corresponding wire bonds are close together. For example, wire bonds 425 and 426 corresponding to lead frames 402 and 408 have equivalent characteristics as shown in FIG. 3. In most embodiments consistent with the present invention, wire bonds between paired lead frames are closely positioned, typically no greater than three times the diameter of one of the bond wires. For a 0.001 inch (1 mil) bond wire, for example, the separation between pairs of wires should be no greater than about 0.003 inches (3 mils) in order to take good advantage of the effects of the mutual inductance. Further, wire bonds 429 and 430 corresponding to lead frames 403 and 409, wire bonds 433 and 434 corresponding with lead frames 404 and 410, wire bonds 437 and 438 corresponding to lead frames 405 and 411, and wire bonds 441 and 442 corresponding to lead frames 406 and 412 are physically close together.

Lead frame pairs 402 and 408,403 and 409, 404 and 410, 405 and 411, and 406 and 412 are directly adjacent in this embodiment, although there is some physical separation to prevent cross-talk between adjacent transmit and receive signals. Corresponding die pads, i.e., die pads 452 and 462 corresponding with lead frames 408 and 402; die pads 454 and 464 corresponding with lead frames 409 and 403; die pads 456 and 466 corresponding with lead frames 410 and 404; die pads 458 and 468 corresponding with die pads 411 and 405; and die pads 460 and 470 corresponding with die pads 412 and 406, are each separated by another pair of die pads that carry PWR/GND signals. This arrangement provides for physical separation of die pads carrying transmit and receive signals and further provides for shielding of wire bond pairs carrying transmit and receive signals from each other.

Lead frames 413, 414, 415, 416, 417, 418, 419, 420, 421, and 422 are coupled to a metallization that is under the metallization of lead frames 401 through 412. Lead frames 413, 414, 415, 416, and 417 are coupled to a power metallization while lead frames 418, 419, 420, 421, and 422 are coupled to a ground metallization. PWR/Gnd signals on lead frame pair 413 and 418 are coupled to die pad pair 461 and 451, respectively, through wire bonds 423 and 424, respectively. PWR/Gnd signals on lead frame pair 414 and 419 are coupled to die pad pair 463 and 453, respectively, through wire bonds 427 and 428, respectively. PWR/Gnd signals on lead frame pair 415 and 420 are coupled to die pad pair 465 and 455, respectively, through wire bonds 431 and 432, respectively. PWR/Gnd signals on lead frames 416 and 421 are coupled to die pad pair 467 and 457, respectively, through wire bonds 435 and 436, respectively. PWR/Gnd signals on lead frames 417 and 422 are coupled to die pads 469 and 459, respectively, through wire bonds 439 and 440, respectively. Further, lead frame pairs and corresponding die pad pairs are positioned such that the corresponding wire bond pair is closely positioned to reduce reactance. In other words, wire bonds 423 and 424, wire bonds 427 and 428, wire bonds 431 and 432, wire bonds 435 and 436, and wire bonds 439 and 440 are physically close. Further, such placement serves to shield and separate wire bonds carrying transmit/receive signals.

Leadframe packages with high signal integrity depend not only on the lead frames and bonding wire arrangements, but also upon compatibility of the power supply filter, which is external to the leadframe package, with the lead frame package. Rx and Tx signal pairs are typically located on the outer package row leads, as shown in FIGS. 3 and 4. Therefore, this allows Rx and Tx signal pairs to be continuously routing in top layer metal on the package and PC board, avoiding the use of inductive multilayer vias, for improved signal integrity. In some embodiments, power supply leads connecting to filter capacitance leads are also routed on the top layer metallization, reducing series inductance.

Figure 5A:
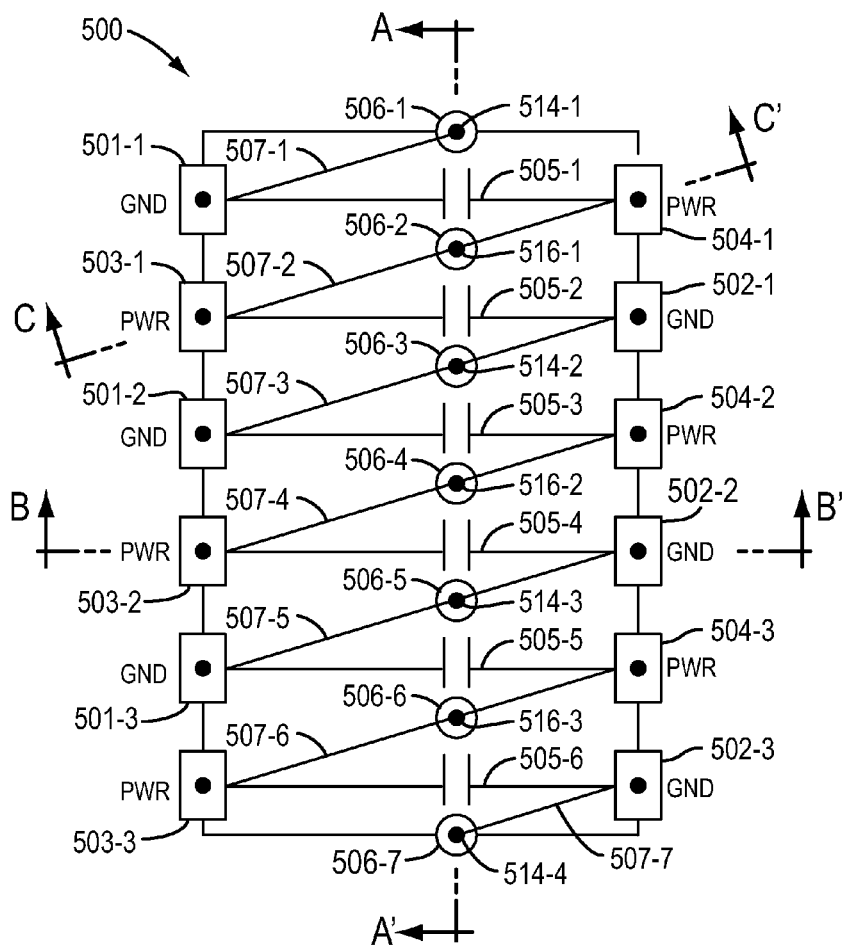
FIG. 5A illustrates a planar view of ground and power metallizations in a lead frame package consistent with some embodiments of the present invention.
Figure 5B:
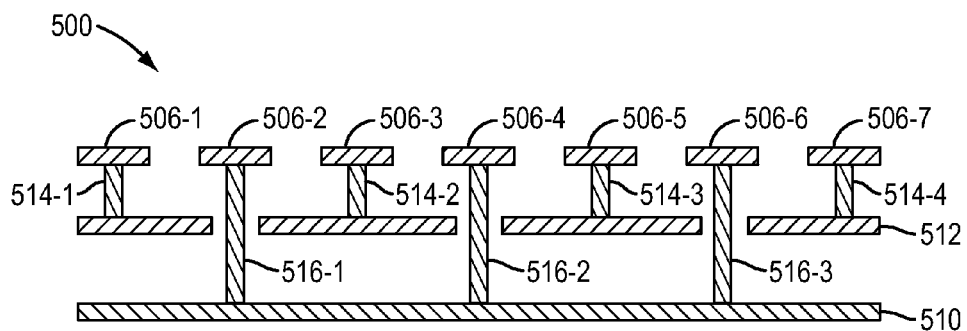
FIGS. 5B, 5C, and 5D illustrate various cross-sectional views of the ground and power metallizations in the lead frame package shown in FIG. 5A.

FIGS. 5A, 5B, 5C, and 5D illustrate some embodiments of a board seat 500 that is consistent with the present invention, which can be utilized with a lead frame package that is consistent with embodiments of the present invention. FIGS. 5A, 5B, 5C, and 5D illustrate the power and ground connections in the underlying metallization of the lead frame package, which is shown in FIG. 1A as metallization 150. As shown in FIG. 5B, the metallization includes a power plane 510 and a ground plane 512 which are coupled to power and ground, respectively. Package lead frames for power and ground lead frames are coupled to power plane 510 and ground plane 512, respectively. As shown in FIG. 3, for example, lead frames 305, 309, 313, and 317 are coupled to ground plane 512 and lead frames 306, 310, 314, and 318 are coupled to power plane 510 through PC board vias. Similarly, in FIG. 4, lead frames 413, 414, 415, 416, and 417 can be coupled to power plane 510 while lead frames 418, 419, 420, 421, and 422 can be coupled to ground plane 512 in the PC board.

FIG. 5A illustrates a planar view of the board seat 500 for a lead frame consistent with embodiments of the present invention. As shown in FIG. 5A, ground metallizations 501-1, 501-2, and 501-3 are separated by power metallizations 503-1, 503-2, and 503-3 and ground metallizations 502-1, 502-2, and 502-3 are separated by power metallizations 504-1, 504-2, and 504-3. As shown in FIG. 5A, ground metallizations 501-1, 501-2, and 501-3 and power metallizations 503-1, 503-2, and 503-3 are located on one side of lead frame package 500 while ground metallizations 502-1, 502-2, and 502-3 and power metallizations 504-1, 504-2, and 504-3 are located on the opposite side of lead frame package 500. The lead frame, not shown in FIG. 5A, is located in the central portion of board seat 500.

As shown in FIG. 5A, ground metallizations 501-2 and 501-3 are coupled across lead frame package 500 with ground metallizations 502-1 and 502-2, respectively. Metal traces 507-1, 507-3, 507-5, and 507-7 couple ground metallizations on each side of lead frame package 500. For example, ground metallizations 501-1 is coupled to metal trace 507-1; ground metallization 501-2 is coupled to ground metallization 502-1 with metal trace 507-3; ground metallization 501-3 is coupled to ground metallization 502-2 with metal trace 507-5; and ground metallization 502-3 is coupled to metal trace 507-7.

Similarly, power metallizations 503-1, 503-2, and 503-3 are coupled across board seat 500 with power metallizations 504-1, 504-2, and 504-3, respectively. Power metallization 503-1 is coupled to power metallization 504-1 with metal trace 507-2, power metallization 503-2 is coupled to power metallization 504-2 with metal trace 507-4, and power metallization 503-3 is coupled to power metallization 504-3 with metal trace 507-6.

As shown in FIG. 5A, each of metal traces 507-1, 507-2, 507-3, 507-4, 507-5, 507-6, and 507-7 includes separate metallizations 506-1, 506-2, 506-3, 506-4, 506-5, 506-6, and 506-7 respectively coupled to a ground plane or a power plane by enhancement vias 514-1, 516-1, 514-2, 516-2, 514-3, 516-3, and 514-4 at the center of the trace.

Further, ground/power pairs across board seat 500 are coupled by capacitors. Therefore, ground metallization 501-1 and power metallization 504-1 are coupled by capacitor 505-1; power metallization 503-1 and ground metallization 502-1 are coupled by capacitor 505-2; ground metallization 501-2 and power metallization 504-2 are coupled by capacitor 505-3; power metallization 503-2 and ground metallization 502-2 are coupled by capacitor 505-4; ground metallization 501-3 and power metallization 504-3 are coupled by capacitor 505-5; and power metallization 503-3 and ground metallization 502-3 are coupled by capacitor 505-6.

FIG. 5B illustrates a cross-sectional view of lead frame package 500 along the line A-A' shown in FIG. 5A. FIG. 5B shows metallizations 506-1 through 506-7, ground plane 512, and power plane 510. As shown in FIG. 5B, metallizations 506-1, 506-3, 506-5, and 506-7 are coupled through enhancement vias 514-1, 514-2, 514-3, and 514-4, respectively, to ground plane 512. Metallizations 506-2, 506-4, and 506-6 are coupled through enhancement vias 516-1, 516-2, and 516-3, respectively, to power plane 510. In some embodiments, the presence of enhancement vias 506-1 through 506-7 can greatly reduce the inductance of the leads to capacitors 505-1 through 505-6.

Figure 5C:
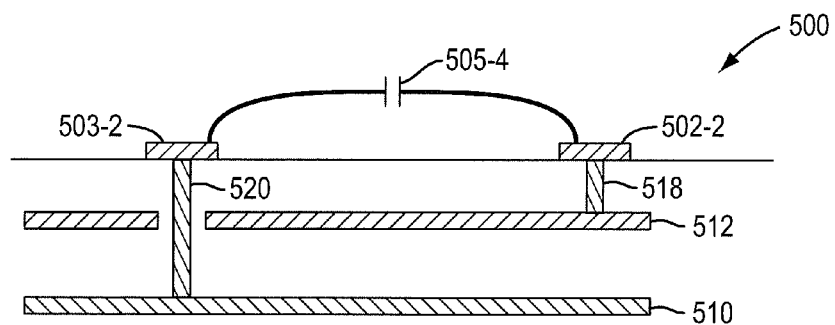

FIG. 5C illustrates a cross-sectional view of board seat 500 along the line B-B' shown in FIG. 5A. As shown in FIG. 5C, ground metallization 502-2 is coupled to ground plane 512 through a via 518 and power metallization 503-2 is coupled to power plane 510 through a via 520. Ground metallization 502-2 and power metallization 503-2 are coupled through capacitor 505-4.

Figure 5D:
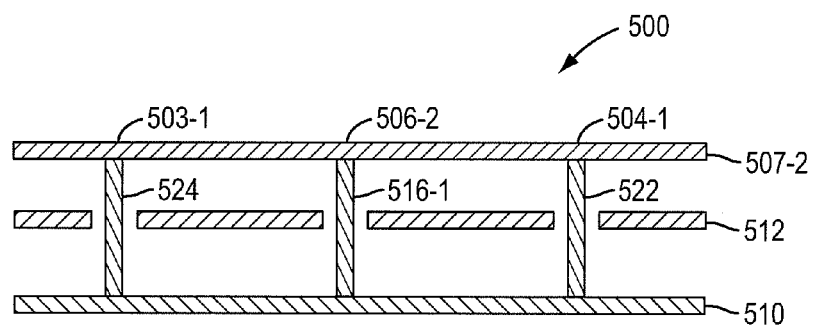

FIG. 5D illustrates a cross-sectional view of board seat 500 along the line C-C' shown in FIG. 5A. As shown in FIG. 5D, metal trace 507-2 couples power metallization 504-1, metallization 506-2, and power metallization 503-1 to power plane 510. Power metallization 504-1 is coupled to power plane 510 through a via 522, metallization 506-2 is coupled to power plane 510 through a via 516-1, and power metallization 503-1 is coupled to power plane 510 through a via 524.

FIGS. 5A, 5B, 5C, and 5D illustrate embodiments of a leadframe design with optimized power/ground filtering. The low inductance, filter capacitance array shown in FIGS. 5A & 5B include enhancement vias 514-1, 516-1, 514-2, 516-2, 514-3, 516-3, and 514-4 between edge vias coupling power and ground metallizations 501-1, 503-1 and 504-1, 503-2 and 504-2, 503-3, and vias coupling power and ground metallizations 504-1, 502-1, 502-1, 504-2, 502-2, 504-3, and 502-3. Power supplies are routed from the package to the filter array in top layer metal facilitated by package leads on the outer rows, thereby avoiding inductive vias.

The reduction of the inductance of a conductive wire has been shown in this disclosure to be reduced by the mutual inductance of a return path wire. Parallel return paths on the top layer metal supply and ground leads are shown in FIG. 5A: alternating metal traces 507-1, 507-2, 507-3, 507-4, 507-5, 507-6 and 507-7. A cross-sectional view of the supply filter component shown in FIG. 5B demonstrates the improved return paths provided by the enhancement PC board vias, 506-1, 506-2, 506-3, 506-4, 506-5, 506-6, and 506-7. Two return loops are introduced by the enhancement vias, for example, vias 516-1 and 514-2 with ground plane 512 and power plain 510 for metallizations 506-2 and 506-3. Vias 516-1 and 516-2 also provide return path for metallizations 506-2 and 506-4 using power plane 510. The external ceramic capacitor, 505-4 connected to nodes 503-2 and 502-2 is shown in FIG. 5C.

A leadframe and board seat combination that accommodates effective supply filters directly reduces signal jitter and attenuation, which are important specifications in the signal integrity of a high speed signal. Via 506-2, which is half way between power metallizations 503-1 and 504-1 on the perimeter of the array, reduces the return loop embodied by metal trace 507-2 by one half. Enhancement via 506-2 has two adjacent vias, enhancement vias 506-1 and 506-3, which also halve the ground loop. Combining the horizontal and vertical halving of the loop by the board design, the net reduction in the loop inductance is one quarter of that without the additional board vias.

The examples provided above are exemplary only and are not intended to be limiting. One skilled in the art may readily devise other lead frame packages consistent with embodiments of the present invention which are intended to be within the scope of this disclosure. As such, the application is limited only by the following claims.

What is claimed is:

1. A lead frame package, comprising:
a first pair of lead frames configured to carry transmission signals and coupled to a first pair of die pads by a first pair of bond wires that are separated by no more than three times a diameter of one of the first pair of bond wires;
a second pair of lead frames, the second pair of lead frames configured to carry a ground/power pair and coupled to a second pair of die pads, which are adjacent to the first pair of die pads, by a second pair of bond wires that are separated by no more than three times a diameter of one of the second pair of bond wires; and
a first ground die pad positioned between the first pair of die pads and the second pair of die pads and down bonded to a first ground metallization by a first ground bond wire.

2. The lead frame package of claim 1, wherein the transmission signals are serial receive or transmit differential signals.

3. The lead frame package of claim 2, further including a third pair of lead frames, the third pair of lead frames configured to carry a ground/power pair and coupled to a third pair of die pads, which are adjacent to the first pair of die pads opposite the second pair of die pads, by a third pair of bond wires that are separated by no more than three times a diameter of one of the third pair of bond wires.

4. The lead frame package of claim 3, including a second ground die pad positioned between the first pair of die pads and the third pair of die pads and down bonded to a second ground metallization by a second ground bond wire.

5. The lead frame package of claim 1, wherein a ground metallization of the second pair of lead frames is coupled to a power metallization through a capacitor.

6. The lead frame package of claim 5, wherein the ground metallization of the second pair of lead frames is coupled to a third ground metallization through a metal trace, wherein the ground metallization of the second pair of lead frames, the metal trace, and the third ground metallization are coupled to a ground plane through vias.

7. A method of coupling signals into a die, comprising:
coupling transmission signals between a first pair of lead frames and a first pair of die pads through a first pair of bond wires that are separated by no more than three times a diameter of one of the first pair of bond wires;
coupling a first power/ground pair between a second pair of lead frames and a second pair of die pads that are adjacent to the first pair of die pads through a second pair of bond wires that are separated by no more than three times a diameter of one of the second pair of bond wires; and
down bonding a first ground die pad positioned between the first pair of die pads and the second pair of die pads to a first ground metallization by a first ground bond wire.

8. The method of claim 7, wherein the transmission signals are either transmit or receive signals.

9. The method of claim 7, further including coupling a second power/ground pair between a third pair of lead frames and a third pair of die pads, which are adjacent to the first pair of die pads opposite the second pair of die pads, through a third pair of bond wires that are separated by no more than three times a diameter of one of the third pair of bond wires.

10. The method of claim 9, further comprising:
down bonding a second ground die pad positioned between the first pair of die pads and the third pair of die pads to a second ground metallization by a second ground bond wire.

11. The method of claim 7, further including coupling a ground metallization of the second pair of lead frames to a power metallization through a capacitor.

12. The method of claim 7, further including coupling the ground metallization of the second pair of lead frames through a metal trace to a third ground metallization, wherein the ground metallization of the second pair of lead frames, the metal trace, and the third ground metallization are coupled to a ground plane through vias.

13. A lead frame package, comprising:
a first pair of lead frames configured to carry transmission signals and coupled to a first pair of die pads by a first pair of bond wires that are separated by no more than three times a diameter of one of the first pair of bond wires; and
a second pair of lead frames, the second pair of lead frames configured to carry a ground/power pair and coupled to a second pair of die pads, which are adjacent to the first pair of die pads, by a second pair of bond wires that are separated by no more than three times a diameter of one of the second pair of bond wires, wherein:
a ground metallization of the second pair of lead frames is coupled to a power metallization through a capacitor; and
the ground metallization of the second pair of lead frames is coupled to a third ground metallization through a metal trace, wherein the ground metallization of the second pair of lead frames, the metal trace, and the third ground metallization are coupled to a ground plane through vias.

14. The lead frame package of claim 13, wherein the transmission signals are serial receive or transmit differential signals.

15. The lead frame package of claim 13, further including a third pair of lead frames, the third pair of lead frames configured to carry a ground/power pair and coupled to a third pair of die pads, which are adjacent to the first pair of die pads opposite the second pair of die pads, by a third pair of bond wires that are separated by no more than three times a diameter of one of the third pair of bond wires.

16. The lead frame package of claim 15, further comprising a second ground die pad positioned between the first pair of die pads and the third pair of die pads and down bonded to a second ground metallization by a second ground bond wire.

* * * * *